(12) United States Patent
Pfirsch et al.

(10) Patent No.: US 6,541,818 B2
(45) Date of Patent: Apr. 1, 2003

(54) FIELD-EFFECT TRANSISTOR CONFIGURATION WITH A TRENCH-SHAPED GATE ELECTRODE AND AN ADDITIONAL HIGHLY DOPED LAYER IN THE BODY REGION

(75) Inventors: Frank Pfirsch, München (DE); Carsten Schäffer, Treffen B. Villach (AU)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/883,808

(22) Filed: Jun. 18, 2001

(65) Prior Publication Data

US 2002/0006703 A1 Jan. 17, 2002

Related U.S. Application Data

(63) Continuation of application No. PCT/DE98/03747, filed on Dec. 18, 1998.

(51) Int. Cl.[7] ................................................. H01L 29/76
(52) U.S. Cl. ........................................ 257/331; 257/330
(58) Field of Search ................................. 257/331, 332, 257/335, 333, 330

(56) References Cited

U.S. PATENT DOCUMENTS

| 4,767,722 A | 8/1988 | Blanchard |
| 4,969,024 A | 11/1990 | Sakurai |
| 4,994,871 A | 2/1991 | Chang et al. |
| 5,468,982 A | 11/1995 | Hshieh et al. |
| 5,821,583 A | 10/1998 | Hshieh et al. |
| 5,998,837 A * | 12/1999 | Williams ................... 257/341 |
| 6,002,143 A * | 12/1999 | Terasawa ..................... 257/77 |
| 6,262,470 B1 * | 7/2001 | Lee et al. ................... 257/565 |

FOREIGN PATENT DOCUMENTS

| DE | 28 01 085 A1 | 7/1978 |
| DE | 196 29 088 A1 | 1/1997 |
| EP | 0 342 952 A2 | 11/1989 |
| EP | 0 633 611 A1 | 1/1995 |
| EP | 0 755 076 A2 | 1/1997 |
| EP | 0 847 090 A2 | 6/1998 |
| GB | 2 314 206 A | 12/1997 |
| WO | 95 24055 | 9/1995 |

OTHER PUBLICATIONS

Z. John Shen et al.: "A New Current Limit Circuit for Smart Discrete Devices", Proceedings of 1998 International Symposium on Power Semiconductor Devices & ICs, Kyoto, pp. 355–358.

* cited by examiner

Primary Examiner—Michael S. Lebentritt
Assistant Examiner—Brad Smith
(74) Attorney, Agent, or Firm—Laurence A. Greenberg; Werner H. Stemer; Ralph E. Locher

(57) ABSTRACT

A field effect transistor configuration with a trench gate electrode and a method for producing the same. An additional highly doped layer is provided in the body region under the source. The layer is used for influencing the conductibility of the source or the threshold voltage in the channel region. Breakdown currents and latch-up effects can thereby be prevented.

14 Claims, 10 Drawing Sheets

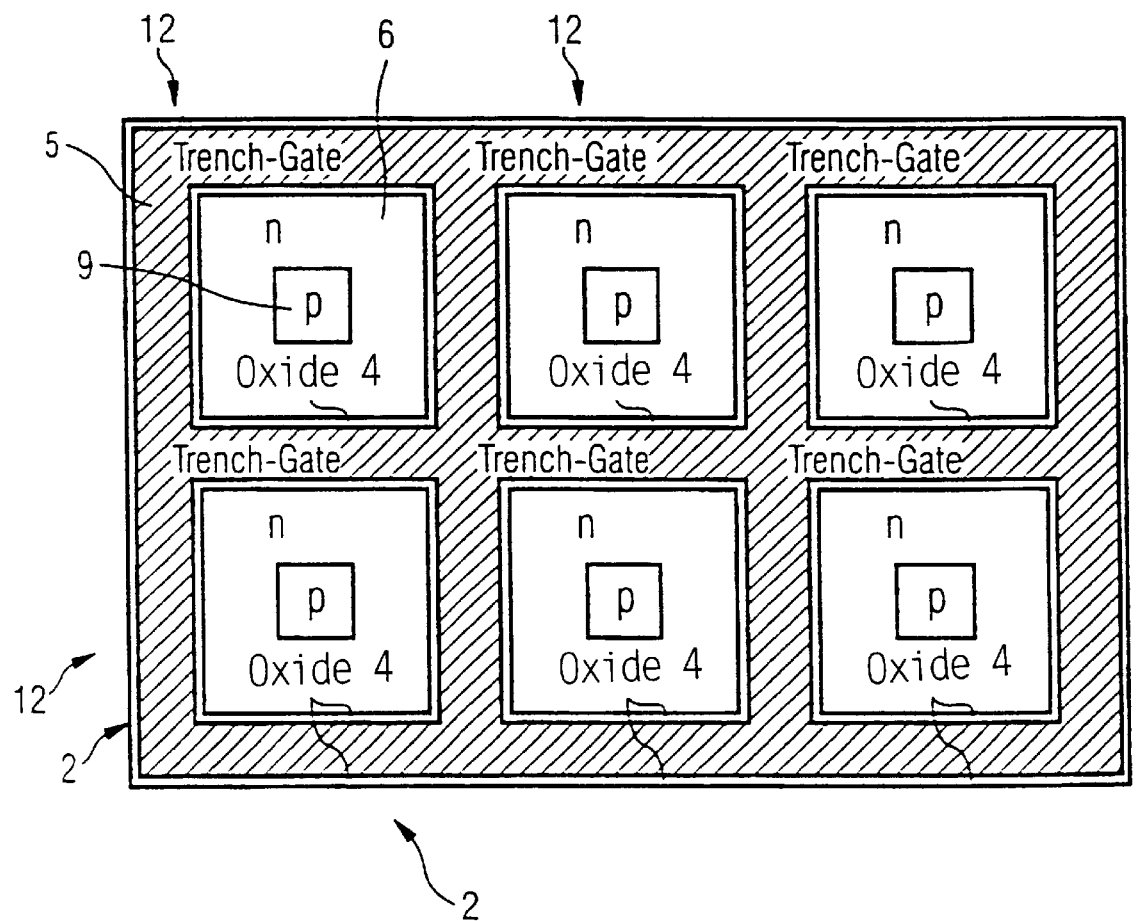

US 6,541,818 B2

FIELD-EFFECT TRANSISTOR CONFIGURATION WITH A TRENCH-SHAPED GATE ELECTRODE AND AN ADDITIONAL HIGHLY DOPED LAYER IN THE BODY REGION

CROSS-REFERENCE TO RELATED APPLICATION

This application is a continuation of copending International Application No. PCT/DE98/03747, filed Dec. 18, 1998, which designated the United States.

BACKGROUND OF THE INVENTION

Field of the Invention

The present invention relates to field-effect transistors with trench-shaped gate electrodes, in which configuration it can be provided that a cell pattern of the transistors is produced by mutually intersecting gate trenches. Mutually intersecting trenches are patterns in which either largely continuous trenches intersect at a point of intersection or trenches are connected to one another at a particular angle, for example at a right angle, at one of their end points. The transistors can be constructed, for example, as MOSFET transistors and as IGBT transistors.

From the prior art it is known, for example from publication EP 0 847 090 or from publication GB 2 314 206, to form a cell pattern of transistors by mutually intersecting trenches. The problem in this configuration is the areas at the corners of the cells at which two trenches meet. Since the doped areas in these corners have two boundary faces to which the dopant can diffuse out, a lower concentration of the dopant is produced in the corners of the cells than in the remaining doped areas of the cell. In addition, the cell corners typically form areas of particularly high electrical field strength. The consequence is that breakdown currents start undesirably early especially in the cell corners or the threshold voltage of the transistor is lower in these areas than in the remaining areas and also may not have adequate long-term stability.

It is, therefore, desirable to avoid the formation of a channel region in the corners of transistor cells. To this end, a configuration is known from U.S. Pat. No. 5,468,982 in which the source region does not extend into the corners of the transistor cell. This can be achieved by masking the cell corners during the production of the source region. However, the disadvantageous factor in this is that an additional masking step becomes necessary for masking the cell corners.

A further problem with the transistor configurations is to achieve resistance to latch-up and short circuits. One possibility for this consists in limiting the maximum current occurring to a value at which the component can still be reliably switched off by using an additional circuit. This is described, for example, in Z. J. Shen and S. P. Robb: A New Current Limit Circuit for Smart Discrete Devices, ISPSD '98, Kyoto 1998, pp. 355–358. However, this measure requires considerable additional circuit expenditure and promotes the occurrence of oscillations.

It is described in U.S. Pat. No. 4,994,871 that the switchable current can be increased in a trench IGBT having additional p-base regions without a source or with a partially cut out source. The disadvantageous factor here is the extracting effect of the additional p regions which, in their conducting state, reduce the carrier flooding and thus increase the forward voltage.

U.S. Pat. No. 4,767,722 points out that the latch-up resistance of a trench-type IGBT can be increased by narrow source regions and thus a reduced lateral base resistance below the source.

A very small distance between adjacent gate trenches, and thus a very high switchable current, is achieved in publication EP 0 755 076. In this configuration, the connection of the p-base region to the contact is conveyed by a p region which is doped more than the source and is diffused in to a lesser depth. However, such an IGBT still needs current limiting since the great channel width allows a short circuit current which is much too great and which would lead to thermal destruction of the component within a very short time.

SUMMARY OF THE INVENTION

It is accordingly an object of the invention to provide a field-effect transistor configuration and a method for producing the configuration which overcomes the above-mentioned disadvantageous of the prior art apparatus and methods of this general type. In particular, it is an object to provide such a field-effect transistor configuration in which the problems of trench-shaped gate electrodes are largely prevented.

With the foregoing and other objects in view there is provided, in accordance with the invention, a field-effect transistor configuration with a trench-shaped gate electrode. The configuration includes: a substrate region having a first surface and being of a first conduction type; at least one trench formed in the substrate and extending from the first surface, the at least one trench defining walls; an insulation layer covering the walls of the at least one trench; a conductive material filling the trench and forming a gate electrode; a source region configured along the trench and extending into the substrate from the first surface of the substrate, the source region being of the first conduction type; a body region extending underneath the source region and adjoining the trench, the body region being of a second conduction type that is opposite the first conduction type; and a drain region adjoining the body region, the drain region being of the first conduction type. The body region includes at least one highly doped region and remaining areas. The highly doped region is of the second conduction type and has a doping concentration that is higher than that in the remaining areas. The highly doped region is configured at least partially below the source region and adjoins the source region. The at least one highly doped region, at least partially, adjoins the trench. The remaining areas of the body region have a starting voltage. The highly doped region has a starting voltage is that higher than the starting voltage in the remaining areas of the body region.

A first embodiment of the invention relates to a field-effect transistor configuration having a trench-shaped gate electrode which extends in a substrate region of the first type of conduction, a source region of the first type of conduction being configured along the entire trench and underneath the source region, a body region of the second type of conduction being provided which adjoins the source region and the trench. However, it is not necessary that the entire body region is covered by the source region in this configuration.

Preferably, only the part of the body region adjoining the trench is covered by the source region.

In accordance with an important feature of the invention, a highly doped region of the second type of conduction is provided in the body region, is configured at least partially below the source region and adjoins the source region in the vertical direction, and at least partially adjoins the trench in the lateral direction. Thus, the highly doped region does not need to be configured exclusively below the source region. Instead, it can be provided that certain parts of the highly doped region extend under the source region but the remaining area of the highly doped region is configured in those areas of the body region which are not covered by a source region. The highly doped region preferably does not adjoin the trench, in which the gate electrode is formed, along its entire outer edge but only in certain part areas.

It is known that the starting voltage depends on the doping concentration in the channel region which is formed at the boundary of the body region to the gate trench. Thus, the highly doped regions of the second type of conduction in the body region lead to a much higher starting voltage in the areas in which the highly doped regions adjoin the gate trench than in the remaining body region. If a voltage that is always lower than this increased starting voltage is applied to the component, no channel can be formed in the areas in which the highly doped regions adjoin the gate trench. This enables the formation of a channel in the usual operating range of the field-effect transistor only in the remaining body region but not in the area of the highly doped regions. This enables regions of the transistor configuration which are particularly at risk to be closed down. Such regions which are particularly at risk are, for example in the case of a transistor cell, the corners of the cell and/or the areas of the trenches in which the alignment of the trench wall does not correspond to a crystal plane which is equivalent to the crystal plane of the substrate having the mirror indices (100). As already known from European patent publication EP 0 847 090, an unwanted early start of breakdown currents can occur in the area of cell corners. On the other hand, the silicon/$SiO_2$ interface at crystal faces which are not equivalent to the crystal plane (100) usually has a much higher interface state density than at the faces which are equivalent to a (100) crystal plane. Because of changes in the saturation of these states in the course of time, the starting voltage of a MOS channel situated there also changes. The consequence can thus be an instability of the starting voltage of the field-effect transistor configuration. These problems can be avoided by the configuration according to the first embodiment of the present invention.

In accordance with another important feature of the invention, it possible to prevent the formation of a channel in all areas of the transistor configuration in normal operating ranges in which this appears to be undesirable or critical.

In accordance with an additional important feature of the invention, the highly doped region in the body region provides the advantage of increasing the conductivity in the body region below the source. This makes it possible to ensure, especially during the turn-off process, that charge carriers are removed much more easily from the body region. This makes it possible to prevent a voltage drop from arising in the body region opposite to the source region which leads to the turn-on of a parasitic bipolar transistor consisting of a source, a body region and a drain region and thus would result in a latch-up of the configuration, especially during turn-off. Although highly doped regions in the area of the body region are known, in principle, from U.S. Pat. Nos. 5,689,128 and 5,821,583, the configurations described there differ distinctly from the subject matter of the present invention.

The first embodiment of the present invention has both the characteristics of preventing the formation of a channel in certain areas of the gate trench and the possibility of improving the conductivity in the body region. However, if both improvements for realizing the concept of the invention are not wanted, one of the improvements can also be dispensed with in each case. If prevention of the formation of a channel in certain areas is not required, it can be provided, therefore, that only an improvement in the conductivity of the body region is achieved by a corresponding configuration of a highly doped region in the area of the body region.

A corresponding configuration is the subject matter of a further embodiment of the present invention. In this case, the highly doped region is configured at a certain distance from the gate trench which is ideally located in the area of the thickness of the highly doped layer.

In accordance with an added feature of the invention, in the further embodiment, the highly doped layer is at most one-third of the thickness of the body region. The thickness of the highly doped layer is ideally 20% of the thickness of the body region at a maximum. This dimensioning of the highly doped layer can also be provided analogously in the first embodiment of the present invention. If this layer is provided with such a relatively small thickness, it can be achieved that the remaining behavior of the body region is not significantly influenced but an improved conductivity can be achieved, nevertheless, in the body region. In particular, the prevention of the formation of an MOS channel can be limited to very narrow areas by having small lateral diffusion of the highly doped layer.

In accordance with an additional feature of the invention, the transistor configuration can be constructed as transistor cell which has at least two mutually intersecting gate trenches. Thus, for example, it can be provided that the transistor cell is constructed as a closed cell which is surrounded by trenches on all sides. The trenches can be at right angles to one another at their end points, for example, and thus form a rectangular cell. However, hexagonal cells, for example, or any other configurations in cell form are also possible.

For the first embodiment of the present invention, the highly doped region does not necessarily need to extend over the entire area of the transistor cell or, respectively, to the center of the transistor cell. It can be sufficient to provide a highly doped region only in the areas in which the channel of the transistor cell is to be closed down. If, however, as good a conductivity as possible is to be additionally achieved in the body region, the highly doped region can be constructed to be correspondingly larger and can extend over wider areas of the body region (in the first embodiment). In particular, it can be provided that the highly doped region extends to the contact area of the body region.

In the case of the second embodiment of the invention it will have to be provided that the highly doped region extends over the widest possible area of the transistor cell in every case. In this case, too, the highly doped region can be contacted, for example, in the area of the center of the transistor cell.

In accordance with another feature of the invention, in both embodiments, the highly doped region can thus be connected to a contact area of the body region and of the source region. The contact area can be constructed as trench contact which extends through the source region to the body region.

For a configuration according to the second embodiment of the invention, an alternative possibility for preventing the formation of a channel in certain areas of the gate trench can also be provided. In this configuration, it can be provided that the source region is configured set back from the trenches in the desired areas, for example in the corners of the transistor cell or in areas which do not correspond to a (100) crystal plane. In these areas, the source region thus does not extend to the gate trench so that it is not possible for a channel to form in these regions.

In both embodiments of the invention, the channel width can be adapted so that the short circuit current occurring in the case of a short circuit can be limited, above all. In this configuration, both the channel width can be adapted per transistor cell and the channel width can be adapted per area. Adaptation per transistor cell can be performed by closing down areas of the channel region, either by means of a p+ region which adjoins the trench or by means of a source region which is set back. Adaptation per area can be done by providing a corresponding distance between the individual transistor cells of the entire pattern, i.e. fewer transistor cells are provided per area. The gate trenches of the transistor cells can be connected to one another by means of connecting trenches which, however, are constructed in such a manner that they do not contribute to the formation of a channel, i.e. these connecting trenches are not adjoined by any channel regions of a body region in which a channel could be produced. Thus, the channel width per area is not influenced by the connecting trenches. However, connecting the individual transistor cells to one another by means of connecting trenches can also be omitted.

The present invention can be used in all types of field-effect transistor configurations. In particular, it can be used in MOSFET transistors. However, it can also be used in a transistor configuration which has an anode zone of the second type of conduction which adjoins the drain zone. This applies, in particular, to an IGBT configuration.

In the following text, embodiments of a method for producing body and source regions of a field-effect transistor are described.

The gate electrodes of the transistor configuration can be produced in accordance with usual methods: at least two mutually intersecting trenches are patterned into the substrate into a first surface. Depending on the configuration of the trenches, it is possible to achieve, in this manner, that a transistor cell is formed which can be constructed especially as a closed cell, i.e. surrounded by trenches on all sides. These trenches can be formed before the body region and the source region of the transistor cell are generated but they can also be formed only after the body region has been formed or after the body region and the source region have been formed. If the trenches are created only after the body region or, respectively, the source region has been formed, care must be taken in the configuration of these regions so that they are already orientated in the correct manner to ensure, for example, that they adjoin the trenches after the trenches have been patterned.

The trenches are lined with an insulation layer which covers the inner walls of the trenches. This can be done, for example, by oxidation or nitration of the trench walls or by depositing insulating material.

This is followed by the trenches being filled up with a conductive material. In principle, any type of conductive material can be used, polysilicon being preferably used as conductive material.

With the foregoing and other objects in view there is also provided, in accordance with the invention, a first method for producing a body region and a source region for a field-effect transistor cell that includes a trench-shaped gate electrode. A substrate of the first type of conduction is provided, the further patterning steps mainly start from a first surface of the substrate. In the substrate provided, a body region of the second type of conduction is created, this second type of conduction being opposite to the first type of conduction so that the body region adjoins the trenches after the trenches have been created. If an n-conducting substrate was initially used, the body region now exhibits a p-type of conduction. Naturally, a p-conducting substrate can also be used to start with, the body region then having an n-type of conduction. The body region is preferably created in such a way that, after the trenches have been created, it adjoins these trenches over the entire length of the trenches. However, if it is required, it can also be provided that the body region is configured setback from the trenches in certain areas after the trenches have been created. After that, a highly doped region of the second type of conduction is formed in the upper area of the body region so that the highly doped region at least partially adjoins the trenches after the trenches have been created. Thus, the highly doped region does not extend over the entire extent of the body region but is provided only in certain areas of the body region. In particular, the highly doped region directly adjoins the trenches only in certain areas and the highly doped region is configured to be set back from the trenches in the remaining areas. The highly doped region is created by introducing dopant, of the second type of conduction, into the body region in a higher concentration that the lower concentration of dopant which already exists. The distribution of the dopant of higher concentration in the body region is controlled by using corresponding masks during the introduction of the dopant. A source region of the first type of conduction is formed the body region. The source region adjoins the trenches over the entire length after the trenches have been created and extends from the surface of the substrate into the substrate. The source region is introduced into the substrate to such a depth that it adjoins the body region and the highly doped region.

In accordance with an added mode of the invention, it is preferably provided that during the formation of the body region and of the highly doped region, these regions also initially extend from the surface of the substrate into the substrate. The source region is then created by introducing a dopant of the first type of conduction from the surface of the substrate. The dopant for the source region is introduced with a higher doping concentration than the doping concentration of the body region and of the highly doped region. Thus, the body region or, respectively, the highly doped region is re-doped in those areas of the body region and of the highly doped region into which the dopant of the first type of conduction is introduced for generating the source region. In those areas, the dopant of the first type of conduction of the source region dominates. The dopant of the source region is introduced into the substrate with a lower depth of penetration than the depth of the body region and of the highly doped region.

In accordance with another mode of the invention, after the source region has been created, a trench contact can be patterned through the source region and extends to the body region. This trench contact can be used for contacting the body region and, in doing so, also the highly doped region.

With the foregoing and other objects in view there is also provided, in accordance with the invention, another method for producing a body region and a source region for a field-effect transistor cell that includes a trench-shaped gate electrode. A substrate of the first type of conduction is provided. A body region of the second type of conduction is formed in the substrate so that the body region adjoins the trenches. In the aforementioned steps, the method and the possibilities for developing the method correspond to the corresponding steps of the first method already described. For the further explanations, reference is thus made to the above places in the text. The second method also includes the following steps. A source region of the first type of conduction is formed above the body region. The source region adjoins the trenches after the trenches have been created and extends from the surface of the substrate into the substrate. In this configuration, it is not necessary that the source region adjoins the trenches over their entire length. Thus, it can be provided that the source region is configured to be set back from the trenches in certain areas. After that, a contact hole is formed through the source region to the body region. This provides for contacting the body region. Finally, a highly doped region of the second type of conduction is formed by introducing dopant of the second type of conduction through the contact opening. Naturally, this method step must take place before the contact hole is filled up with a contact or conduction material for contacting the body region.

In this method, the source region, the body region and the highly doped region can be created in the following manner.

First, the body region is created starting from the surface of the substrate so that the body region extends into the substrate. Then the source region is created by introducing dopant of the first type of conduction into the substrate. The dopant of the first type of conduction extends to a lesser depth than the body region. However, the doping concentration of the dopant of the first type of conduction is selected to be higher than the doping concentration of the body region. Thus, the area in the vicinity of the surface of the substrate is redoped and a source region of the first type of conduction is produced.

The highly doped region of the second type of conduction is created by introducing dopant of the second type of conduction through the contact hole. The doping concentration of the second type of conduction is selected to be higher than that of the body region but lower than that of the source region. Thus, an area of higher doping concentration is produced in the area of the contact hole, but there is no re-doping in the area of the source region so that the source region remains largely unchanged. This automatically produces a highly doped region of the second type of conduction in the body region which immediately adjoins the source region.

However, it can also be provided that the highly doped region is not created via the contact hole, but as in the first method, by introducing dopant of a higher concentration into the body region before forming the source region. The distribution of the dopant is again controlled by means of masks. This makes it possible to achieve that, in the body region, the highly doped region has a lateral extent which is different from the vertical extent. Thus, the distance between the highly doped region and the gate trench can be varied, the layer thickness largely remaining the same.

In each of the two methods described, the usual further processing of the transistor configuration then takes place such as, for example, the application of metallizations or the generation of an anode zone of the second type of conduction in the case of the creation of an IGBT. These further steps are sufficiently well known in the prior art. Similarly, the process steps usually performed in the prior art such as, for example, the use of a $p^+$ substrate with epitaxial layers for n buffers and an $n^-$ base as the starting material for an IGBT or, respectively, the use of an $n^+$ substrate with $n^-$ epitaxial layer for a power MOSFET are known.

Other features which are considered as characteristic for the invention are set forth in the appended claims.

Although the invention is illustrated and described herein as embodied in a field-effect transistor configuration with a trench-shaped gate electrode and an additional highly doped layer in the body region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 8a shows an example of a transistor cell configuration with a square cell pattern of gate trenches;

DESCRIPTION OF THE PREFERRED EMBODIMENTS

Figure 1:
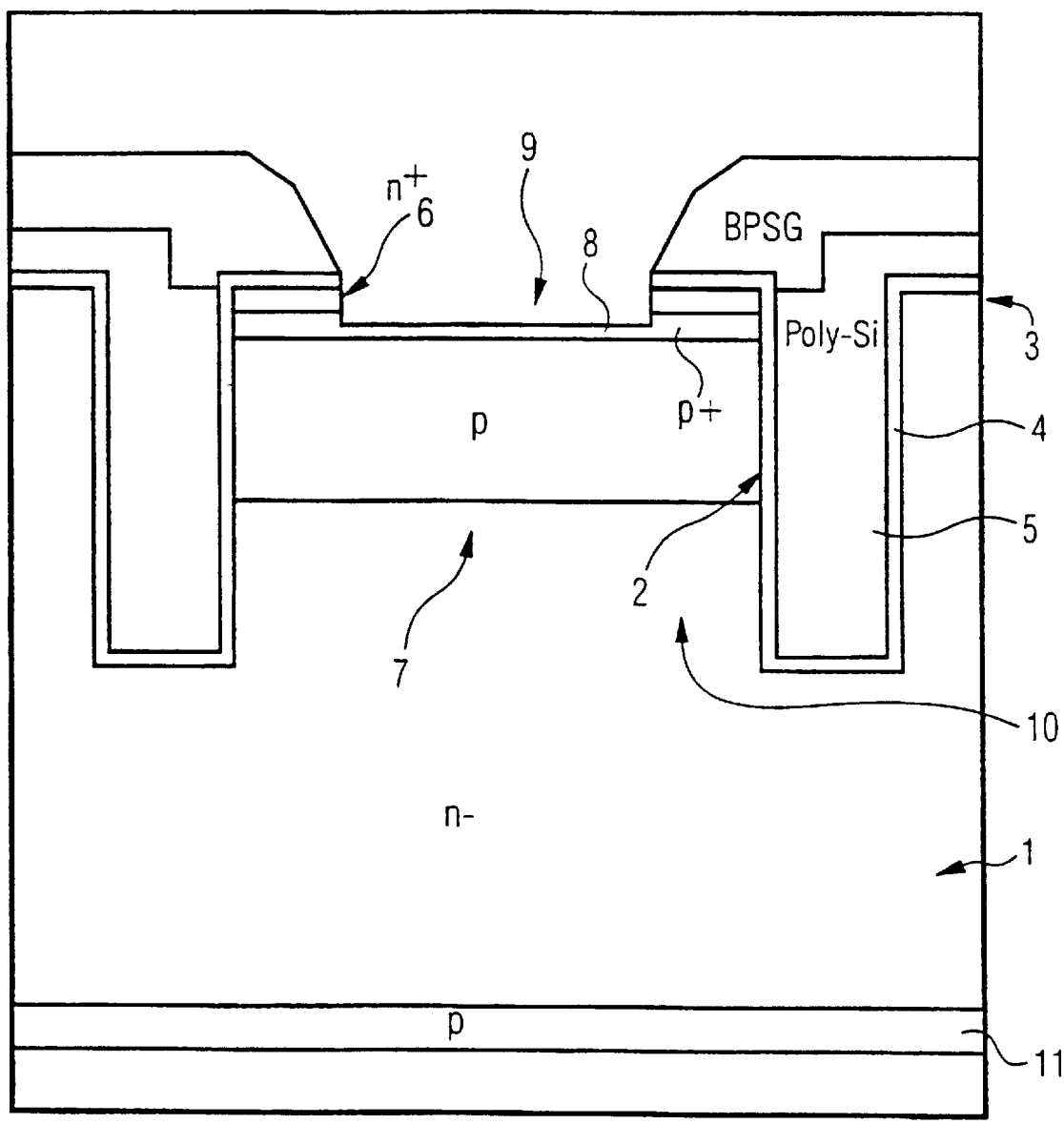
FIG. 1 shows an IGBT with trench-shaped gate electrode and highly doped region in the body region which adjoins the gate trench in the area of the cross section shown.
Figure 2:
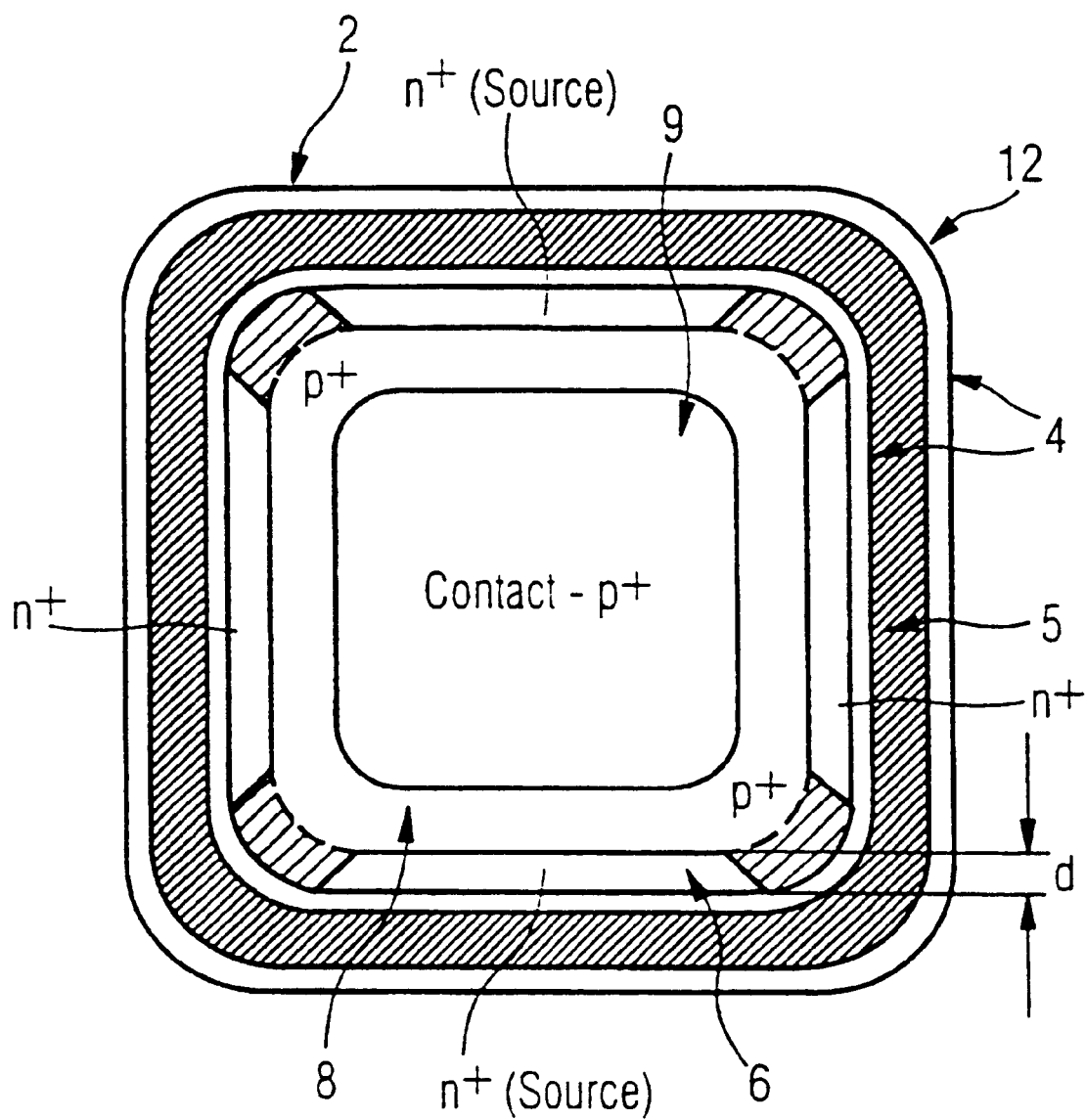
FIG. 2 shows a top view of a configuration according to FIG. 1, the highly doped region adjoining the trench in the corners.

Referring now to the figures of the drawing in detail and first, particularly, to FIG. 1 thereof, there is shown a trench-type IGBT, i.e. an IGBT with trench-shaped gate electrodes. Source region 6 and body region 7 are in each case configured between two trenches 2. The trenches 2 can form a transistor cell 12 as is shown in an example in FIG. 2. The transistor cell 12 in FIG. 2 is formed in a square shape which is surrounded by a closed trench 2. Naturally, other shapes can also be provided for the transistor cell 12 such as, for example, rectangular or hexagonal.

Figure 8B:
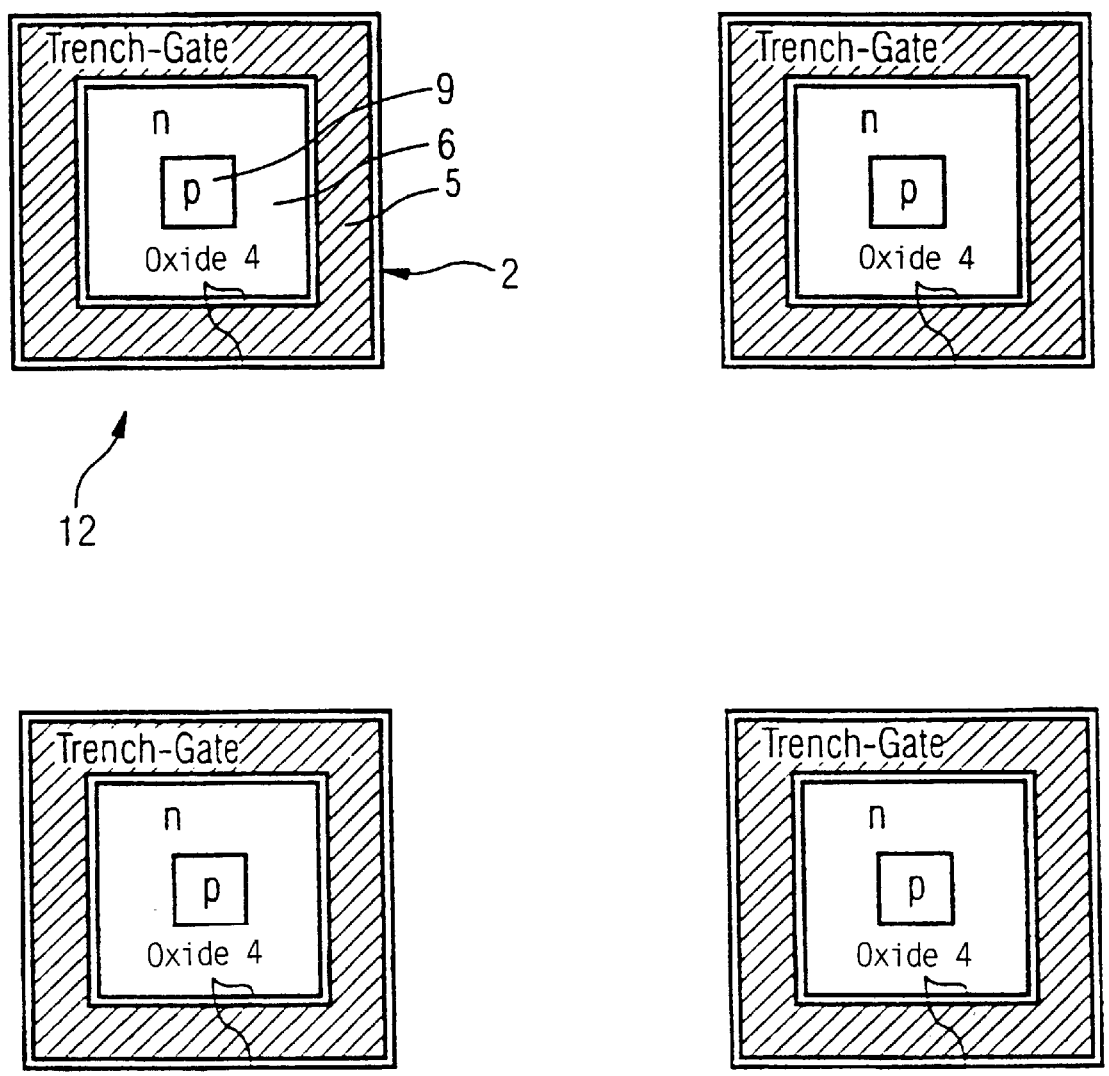
FIG. 8b shows an example of a cell configuration with insulated square cells.
Figure 8C:
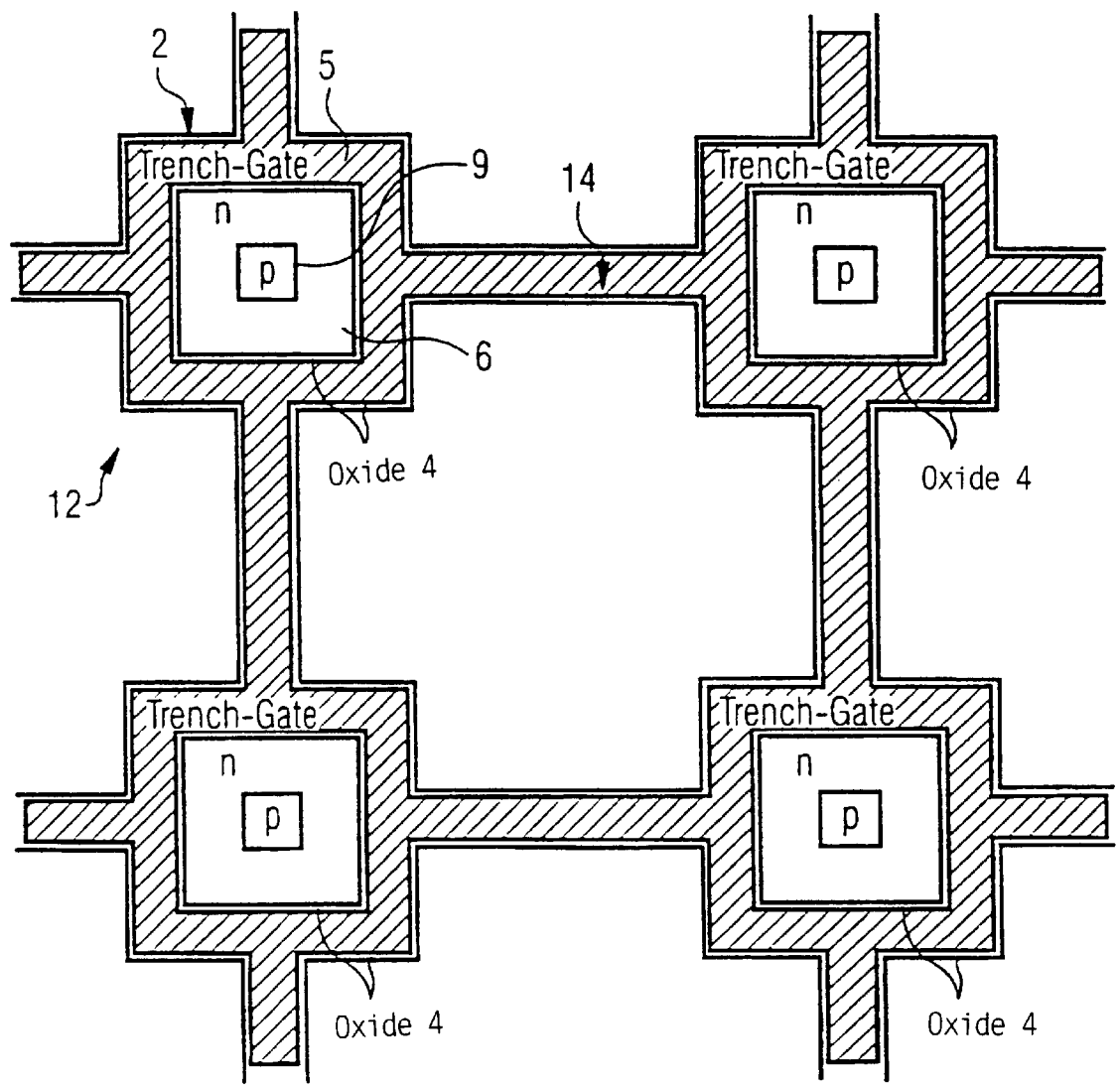
FIG. 8c shows an example of a cell configuration with square cells having connecting trenches.
Figure 8D:
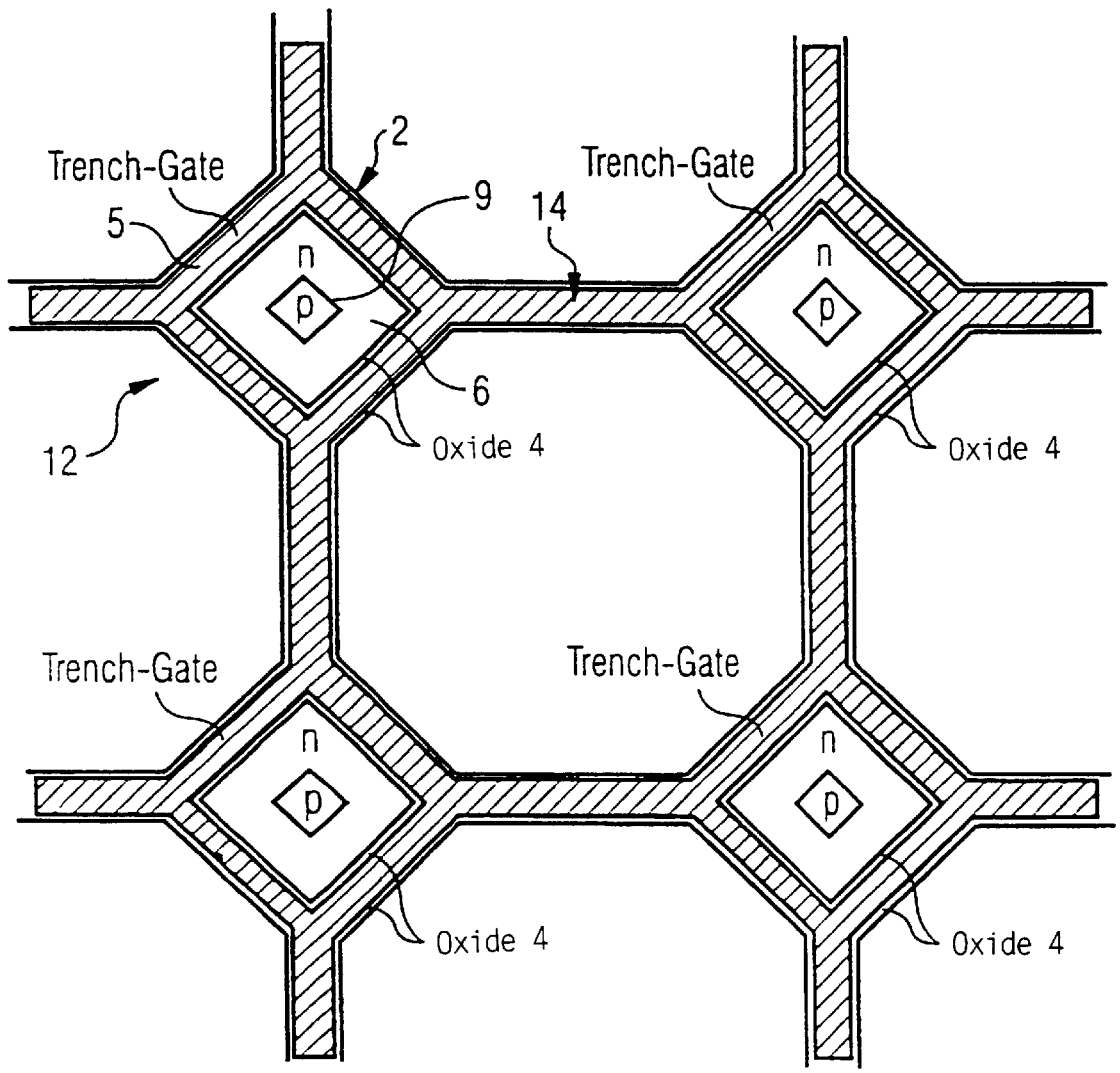
FIG. 8d shows an example of a cell configuration that is the same as that shown in FIG. 8c but with connections implemented using the cell corners.

Various configurations of the transistor cells 12 can be provided to form an overall cell pattern. Some examples of this are shown in FIGS. 8a to d. Thus, a number of or all of the transistor cells 12 can be connected to one another. In such a configuration, the closed gate trench patterns 2 can be connected to one another by connecting trenches 14 (FIGS. 8c and 8d) or the cells can directly adjoin one another as shown in FIG. 8a and thus are connected to one another by common gate trenches 2. In the case shown in FIG. 8a, a channel region is created on both sides of the gate trenches 2 which connect two cells 12. In the cases shown in FIGS. 8c and d, a channel region is only created on one side of a gate trench 2 and no channel regions are produced along the connecting trenches 14. However, the cells can also be configured completely separate from one another as is shown in FIG. 8b.

The gate trenches 2 extend from a surface 3 of the substrate 1 into the substrate 1 and are lined with an insulation layer 4 which can consist, for example, of silicon oxide. The trenches 2 are filled with a conductive material 5 which can consist, for example, of polysilicon. The source regions 6, which exhibit doping of the $n^+$ type, adjoin these gate trenches 2 over the entire length of the trenches 2. The body region 7 is configured below the source region 6 and the body region 7 exhibits p-type doping. In the upper part of the body region which adjoins the source, a highly doped $p^+$ region 8 is provided.

The highly doped region 8 vertically directly adjoins the source 6 but only adjoins the gate trenches 2 laterally, in partial areas. FIG. 2 shows that the highly doped region 8 only adjoins the trenches 2 in the corners of the transistor cell 12. In the remaining areas, the highly doped region 8 is configured to be set back from the trenches. The shaded regions in the cell corners in FIG. 2 are intended to indicate that the source region 6 also extends into the corners of the transistor cell and is configured above the highly doped region 8 in these areas. Thus, the source region 6 extends along the entire length of the trenches 2. Thus, FIG. 1 corresponds, for example, to a diagonal section through two corners of FIG. 2.

In the corners of the transistor cell in which the highly doped region 8 directly adjoins the trenches and is covered over by the source region 6, the starting voltage for a channel is mainly determined by the doping of the highly doped region 8. This starting voltage is higher than the starting voltage for the remaining areas in which the channel forms at the boundary between the body region 7 and the trenches 2. The starting voltage is determined there by the lower concentration of the body region 7 and is thus lower than in the corners of the transistor cell 12. It is thus possible to achieve, by correspondingly selecting the doping of the highly doped region 8 and of the operating areas of the transistor cell 12, that the starting voltage is not reached in the corners of the transistor cell 12 and no channel can form in these areas of the transistor cell.

The body region 7 and the highly doped region 8 are contacted via a trench contact 9 which is filled with conductive material. At the same time, the source region 6 is also conductively connected to the body region 7 and the highly doped region 8 by means of this trench contact 9. This makes it possible to largely prevent the source region 6 and the body region 7 or, respectively, the highly doped region 8 from acting as part of a parasitic npn transistor.

On the opposite side of the substrate 1, a p-doped layer is also provided as an anode zone 11.

In principle, the highly doped layer 8 according to FIG. 1 can be selected to have any thickness. It only needs to be possible to be able to obtain a starting voltage that is significantly increased in the regions in which the highly doped layer 8 adjoins the trench 2. In a special embodiment, however, the highly doped layer 8 can be selected to be relatively thin in comparison with the body region 7. In this configuration, it can be provided that the thickness of the highly doped region 8 is a maximum of ⅓ of the thickness of the body region 7, ideally only a maximum of 20% of the thickness of the body region 7. Thus, for example, the body region can have a thickness of 1 µm to about 3 µm and the thickness of the highly doped region 8 can have values from 0.2 µm to about 1 µm.

Figure 3:
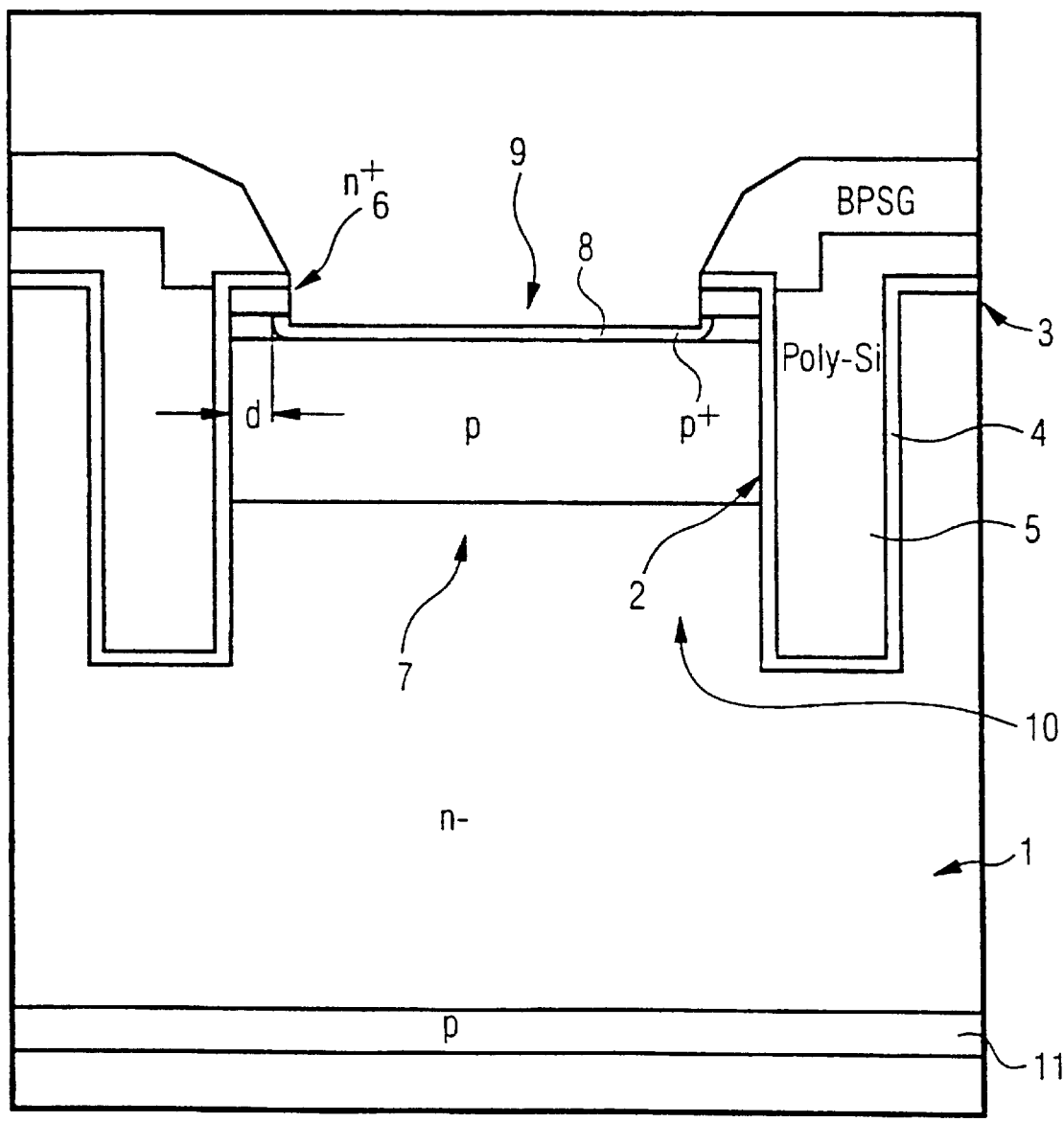
FIG. 3 shows an IGBT with trench-shaped gate electrode and highly doped region in the body region which was introduced through the contact opening.

FIG. 3 shows another exemplary embodiment of the present invention. This exemplary embodiment essentially corresponds to the exemplary embodiment of FIG. 1. The significant difference is, however, that the highly doped region 8 does not extend to the trenches 2. The highly doped region 8 is configured to be set back from the trenches 2 by a certain distance d. In this configuration, the highly doped region 8 is provided as a relatively thin layer which also exhibits only ⅓ of the thickness of the body region 7, ideally a maximum of 20% of the thickness of the body region. The highly doped region is constructed in this configuration as a layer having a largely uniform thickness along the trench contact 9 and can be created, e.g. by implantation into the contact hole.

Figure 4:
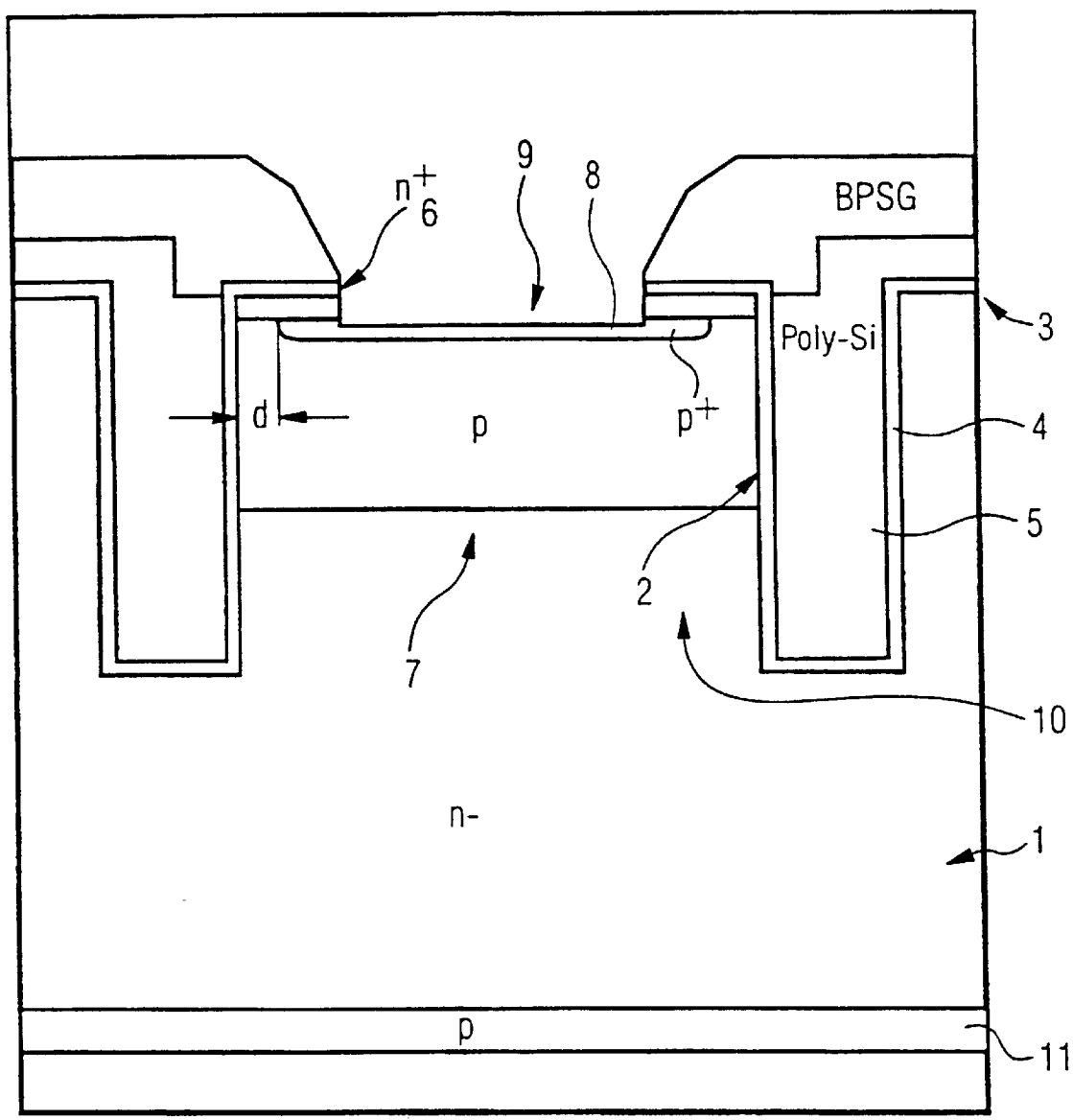
FIG. 4 shows a configuration as in FIG. 3 but with a highly doped region which was introduced independently of the contact hole.

FIG. 4 shows an alternative embodiment with respect to FIG. 3, a smaller contact hole 9 being provided. This is appropriate if there is a risk that a short circuit can arise between the contact metal to the source and body contact and the gate electrode 5 when there are slight misalignments during the patterning of the configuration due to the topographical pattern. A reduction in the size of the contact hole 9 provides additional reliability in this case. It is provided in this case that the highly doped region 8 is not introduced through the contact hole 9 but is patterned by a separate enamel mask and is already introduced into the body region before the contact hole is created. During this process, the lateral and vertical extent of the highly doped region 8 can also be designed to be different. Thus, for example, the highly doped region 8 can have a greater extent in the lateral direction than in the vertical direction as indicated in FIG. 4. On the one hand, this considerably improves the conductivity of the body region 7 in the lateral direction. However, the remaining part of the body region 7 remains largely unaffected by the slight vertical extent of the highly doped region 8. On the other hand, the distance d to the trench 2 can be varied in a relatively simple manner, and thus the effect of the highly doped layer 8 can also be influenced in the vicinity of the trench 2.

In both exemplary embodiments, the distance d between the highly doped region 8 and the gate trench 2 is selected to be less than 1 µm, preferably less than 0.7 µm.

Figure 5:
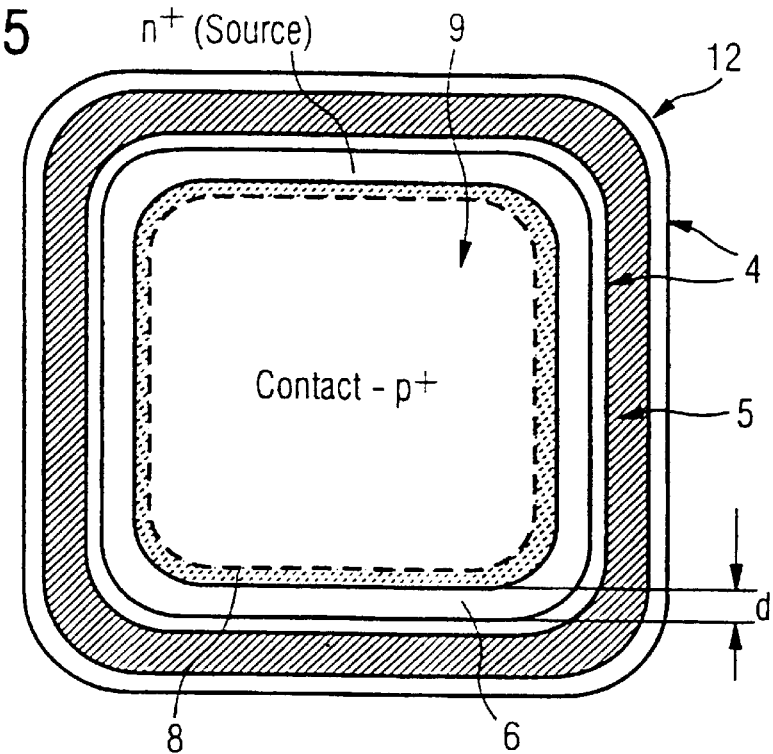
FIG. 5 shows a top view of a configuration according to FIG. 3 or FIG. 4.

FIG. 5 shows a top view of a configuration according to FIG. 3 or 4, in which the area of the highly doped region 8 which is covered over by the source 6 is represented by a shaded area.

Figure 6:
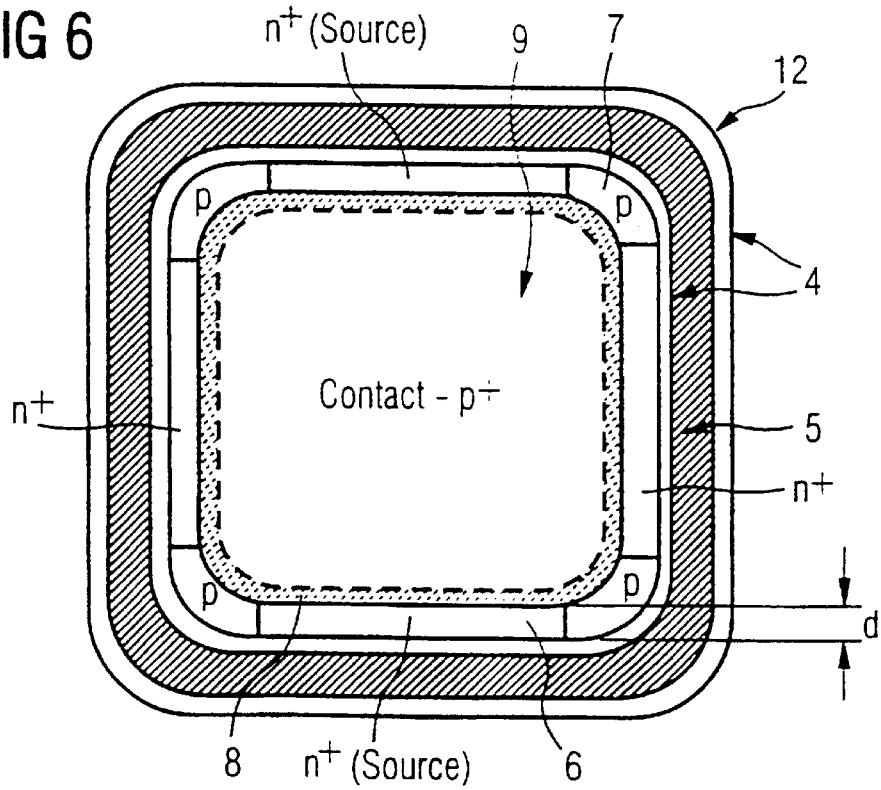
FIG. 6 shows a configuration as in FIG. 5 but with cut-outs in the source in the corners of the cell.

FIG. 6 corresponds to the representation in FIG. 5, but the source regions 6 are cut out in the corners of the transistor cell 12, i.e. the source is configured set back from the trenches 2 in the area of the corners. This can be achieved by appropriate masking steps during the production process. This makes it possible to prevent the formation of a channel in the corners of the transistor cell 12.

Figure 7A:
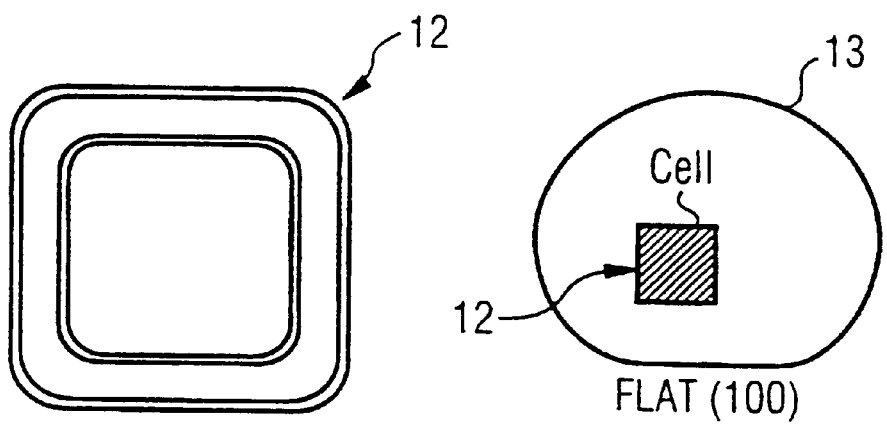
FIG. 7a shows a configuration of the transistor cell when the wafer is aligned along a (100) equivalent crystal plane.

FIGS. 7a and b illustrate the alignment of a transistor cell in a preferred embodiment on a wafer. In both cases, the starting point is a four-cornered transistor cell, a square transistor cell in the representation. During alignment of the transistor cell on the wafer, a part of the transistor cell 12 is configured, as much as possible, such that negative influences with respect to the operation of the transistor cell can be prevented, particularly with respect to the formation of channels and the starting voltage.

In FIG. 7a, the wafer 13 is aligned along a crystal plane which is equivalent to the (100) crystal plane. In this case, the transistor cell 12 is aligned in such a manner that the sides of the transistor cell 12 are aligned either along the main direction of the wafer 13 or at an angle of 90° to this main direction. The result is that the sides of the transistor cell are aligned along a plane which is equivalent to the (100) plane of the substrate.

Figure 7B:
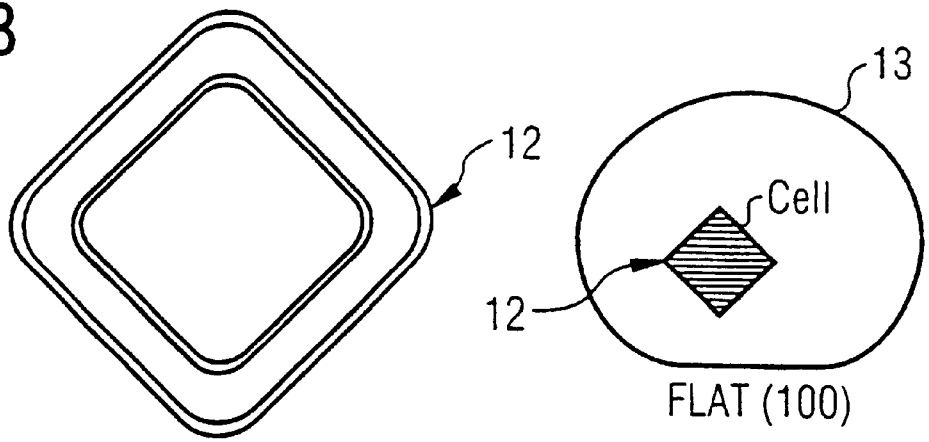
FIG. 7b shows a configuration of the transistor cell when the wafer is aligned along a (110) equivalent crystal plane.

In the case of FIG. 7b, the wafer was aligned along a (110) equivalent crystal plane. In this case, the sides of the transistor cell are configured at an angle of 45° to the main direction of the wafer 13. The result is, again, that the sides are aligned along a crystal plane which is equivalent to the (100) crystal plane of the substrate.

The result is in both cases that the largest possible part of the sides of the transistor cell, i.e. the largest possible part of the gate trenches 2 is oriented along a (100)—equivalent crystal plane. Thus, the side walls of the trenches 2 are configured along crystal planes which do not correspond to the crystal plane (100) only in the corners of the transistor cell 12. This makes it possible to largely prevent interfering influences resulting from fluctuations in the interface state densities at the differently oriented crystal planes.

The configuration of many transistor cells 12 on a wafer 13 can be, for example, in a square pattern in which the gate electrodes 5 in the trenches 2 can be connected to one another by further trenches. Examples of configurations of the transistor cells 12 are shown in FIGS. 8a to d.

We claim:

1. A field-effect transistor configuration with a trench-shaped gate electrode, comprising:

a substrate region having a first surface and being of a first conduction type;

at least one trench formed in said substrate and extending from said first surface, said at least one trench defining walls;

an insulation layer covering said walls of said at least one trench;

a conductive material filling said trench and forming a gate electrode;

a source region configured along said trench and extending into said substrate from said first surface of said substrate, said source region being of the first conduction type;

a body region extending underneath said source region and adjoining said trench, said body region being of a second conduction type that is opposite the first conduction type; and a drain region adjoining said body region, said drain region being of the first conduction type;

said body region including at least one highly doped region and remaining areas, said highly doped region being of the second conduction type and having a doping concentration that is higher than that in said remaining areas, said highly doped region configured at least partially below said source region and adjoining said source region;

said at least one highly doped region, at least partially, adjoining said trench;

said body region having a thickness; and said highly doped region having a thickness being not greater than one-third of said thickness of said body region.

2. The transistor configuration according to claim 1, wherein said thickness of said highly doped region is not greater than 20% of said thickness of said body region.

3. The transistor configuration according to claim 1, wherein said thickness of said highly doped region is not greater than 20% of said thickness of said body region.

4. The transistor configuration according to claim 1, wherein said at least one trench includes at least two mutually intersecting trenches that at least partially define a transistor cell.

5. The transistor configuration according to claim 4, wherein:

said substrate has a crystal plane;

said at least two trenches have non-aligned areas in which alignment of at least one of said trench walls does not correspond to said crystal plane of said substrate, and said at least two trenches have remaining areas;

said at least one highly doped region adjoins said at least two trenches in said non-aligned areas of said trenches; and said at least one highly doped region is set back from said remaining areas of said trenches.

6. The transistor configuration according to claim 5, wherein:

said at least two trenches intersect to form at least one corner of said transistor cell;

said at least one highly doped region adjoins said corner formed by said trenches and is set back from said remaining areas of said trenches.

7. The transistor configuration according to claim 4, wherein:

said at least two trenches intersect to form at least one corner of said transistor cell;

said at least two trenches include said corner and include remaining areas other than said corner;

said at least one highly doped region adjoins said corner and is set back from said remaining areas of said at least two trenches.

8. The transistor configuration according to claim 7, wherein said at least one highly doped region is set back from said remaining areas of said trenches by a distance of at most 1 $\mu$m.

9. The transistor configuration according to claim 4, wherein:

said substrate has a crystal plane;

said at least two trenches have non-aligned areas in which alignment of at least one of said trench walls does not correspond to said crystal plane of said substrate, and said at least two trenches have remaining areas;

said at least one highly doped region adjoins said at least two trenches in said non-aligned areas of said trenches;

said at least one highly doped region is set back from said remaining areas of said trenches; and said at least one highly doped region is set back from said remaining areas of said trenches by a distance of at most 1 $\mu$m.

10. The transistor configuration according to claim 4, wherein:

said transistor cell is constructed as a closed cell having cell corners and a center;

said transistor cell is surrounded by said trenches; and said at least one highly doped region extends from said cell corners to said center of said transistor cell.

11. The transistor configuration according to claim 1, wherein said body region and said source region share a contacting part that is connected to said at least one highly doped region.

12. The transistor configuration according to claim 11, wherein said contacting part is constructed as a trench contact extending through said source region to said body region.

13. The transistor configuration according to claim 1, comprising an anode zone of the second conduction type that adjoins said drain zone.

14. A field-effect transistor configuration with a trench-shaped gate electrode, comprising:

a substrate region having a first surface and being of a first conduction type;

at least one trench formed in said substrate and extending from said first surface, said at least one trench defining walls;

an insulation layer covering said walls of said at least one trench;

a conductive material filling said trench and forming a gate electrode;

a source region configured along said trench and extending into said substrate from said first surface of said substrate, said source region being of the first conduction type;

a body region extending underneath said source region and adjoining said trench, said body region being of a second conduction type that is opposite the first conduction type; and a drain region adjoining said body region, said drain region being of the first conduction type;

said body region including at least one highly doped region and remaining areas, said highly doped region being of the second conduction type and having a doping concentration that is higher than that in said remaining areas, said highly doped region configured at least partially below said source region and adjoining said source region;

said at least one highly doped region, at least partially, adjoining said trench;

said body region and said source region sharing a contacting part connected to said at least one highly doped region; and said contacting part constructed as a trench contact extending through said source region to said body region.

* * * * *